(12) United States Patent
Aketa (10) Patent No.: US 10,876,711 B2
(45) Date of Patent: Dec. 29, 2020

(54) COLOR CONVERSION ELEMENT AND LIGHTING DEVICE

(71) Applicant: PANASONIC INTELLECTUAL PROPERTY MANAGEMENT CO., LTD., Osaka (JP)

(72) Inventor: Takanori Aketa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 44 days.

(21) Appl. No.: 16/318,873

(22) PCT Filed: Jun. 16, 2017

(86) PCT No.: PCT/JP2017/022316
§ 371 (c)(1),
(2) Date: Jan. 18, 2019

(87) PCT Pub. No.: WO2018/042826
PCT Pub. Date: Mar. 8, 2018

(65) Prior Publication Data
US 2019/0264894 A1    Aug. 29, 2019

(30) Foreign Application Priority Data
Aug. 30, 2016    (JP) ................ 2016-168571

(51) Int. Cl.
*F21V 9/32*    (2018.01)
*C03C 17/36*    (2006.01)
(Continued)

(52) U.S. Cl.
CPC ............ *F21V 9/32* (2018.02); *C03C 17/3607* (2013.01); *C03C 17/3655* (2013.01); *F21V 9/38* (2018.02);
(Continued)

(58) Field of Classification Search
CPC ......... F21V 9/32; F21V 9/38; C03C 17/3655; F21K 9/64
(Continued)

(56) References Cited

U.S. PATENT DOCUMENTS

| 10,520,165 B1* | 12/2019 | Mao ........................ F21V 13/14 |
| 2007/0064767 A1* | 3/2007 | Graff ...................... G01K 11/20 |
| | | 374/161 |

(Continued)

FOREIGN PATENT DOCUMENTS

| JP | 2012155003 | * 1/2011 | ............. G03B 21/00 |
| JP | 2012-015001 A | 1/2012 | |

(Continued)

OTHER PUBLICATIONS

International Search Report and Written Opinion issued in International Patent Application No. PCT/JP2017/022316, dated Sep. 19, 2017; with partial English translation.

(Continued)

*Primary Examiner* — Julie A Bannan
(74) *Attorney, Agent, or Firm* — McDermott Will & Emery LLP (57) ABSTRACT

A color conversion element includes: a phosphor layer that includes at least one type of phosphor; a reflecting layer stacked on the phosphor layer; a substrate disposed in a position opposite to the reflecting layer; a joining portion interposed between the reflecting layer and the substrate for joining the reflecting layer and the substrate; and an absorbing portion disposed above a principal surface of the substrate closer to the joining portion. The absorbing portion is covered with the joining portion and absorbs laser light having a wavelength that excites the phosphor.

7 Claims, 3 Drawing Sheets

(51) Int. Cl.
*F21V 23/00* (2015.01)
*G02B 5/20* (2006.01)
*H01S 5/022* (2006.01)
*H01L 33/00* (2010.01)
*F21V 9/38* (2018.01)
*G02B 5/22* (2006.01)
*F21Y 115/30* (2016.01)
*F21V 8/00* (2006.01)

(52) U.S. Cl.
CPC .............. *F21V 23/003* (2013.01); *G02B 5/20* (2013.01); *G02B 5/208* (2013.01); *G02B 5/22* (2013.01); *H01L 33/00* (2013.01); *H01S 5/022* (2013.01); *C03C 2217/214* (2013.01); *C03C 2217/231* (2013.01); *C03C 2217/944* (2013.01); *C03C 2217/948* (2013.01); *C03C 2218/115* (2013.01); *C03C 2218/154* (2013.01); *F21Y 2115/30* (2016.08); *G02B 6/0005* (2013.01)

(58) Field of Classification Search
USPC .................................. 313/501, 502; 374/161
See application file for complete search history.

(56) References Cited

U.S. PATENT DOCUMENTS

| | | | |
|---|---|---|---|
| 2010/0109036 A1* | 5/2010 | Chen | H01L 33/60 257/98 |
| 2011/0115406 A1 | 5/2011 | Wang et al. | |
| 2012/0230007 A1 | 9/2012 | Kawakami | |
| 2013/0003400 A1 | 1/2013 | Kijima et al. | |
| 2013/0107573 A1* | 5/2013 | Kadomi | G02F 1/133617 362/611 |
| 2013/0229598 A1* | 9/2013 | Kamada | G02B 5/23 349/69 |
| 2013/0234298 A1 | 9/2013 | Mitsugi et al. | |
| 2015/0077982 A1 | 3/2015 | Urano et al. | |

FOREIGN PATENT DOCUMENTS

| | | |
|---|---|---|
| JP | 2012-155003 A | 8/2012 |
| JP | 2012-190628 A | 10/2012 |
| JP | 2012-226986 A | 11/2012 |
| JP | 2013-012358 A | 1/2013 |
| JP | 2013-511846 A | 4/2013 |
| JP | 2013-125764 A | 6/2013 |
| JP | 2013-229174 A | 11/2013 |
| JP | 2013-254071 A | 12/2013 |
| WO | 2012/026206 A1 | 3/2012 |
| WO | 2012/063864 A1 | 5/2012 |
| WO | 2013/179624 A1 | 12/2013 |
| WO | 2013/179625 A1 | 12/2013 |
| WO | 2016/128031 A1 | 8/2016 |

OTHER PUBLICATIONS

Extended European Search Report dated Aug. 13, 2019 issued for the corresponding EP patent application No. 17845837.8.

* cited by examiner

COLOR CONVERSION ELEMENT AND LIGHTING DEVICE

CROSS-REFERENCE OF RELATED APPLICATIONS

This application is the U.S. National Phase under 35 U.S.C. § 371 of International Patent Application No. PCT/JP2017/022316, filed on Jun. 16, 2017, which in turn claims the benefit of Japanese Application No. 2016-168571, filed on Aug. 30, 2016, the entire disclosures of which Applications are incorporated by reference herein.

TECHNICAL FIELD

The present invention relates to a color conversion element in which a phosphor layer is stacked above a substrate and a lighting device which includes the color conversion element.

BACKGROUND ART

Conventionally, a lighting device is known which emits light having a desired color as a result of converting the color of laser light transmitted via a light guiding component to a light emitting element in which a phosphor layer is stacked above a substrate with a reflecting layer interposed therebetween (for example, see Patent Literature (PTL) 1). Specifically, when the laser light transmitted via the light guiding component is emitted onto the phosphor layer of the light emitting element, a portion of the laser light directly shines on phosphor particles in the phosphor layer. In addition, another portion of the laser light that does not directly shine on the phosphor particles is reflected by the reflecting layer and shines on the phosphor particles. The phosphor particles convert the laser light that has reached the phosphor particles into white light and emit the white light. A portion of the white light emitted from the phosphor particles is directly emitted out of the phosphor layer. Another portion of the white light emitted from the phosphor particles is also emitted out of the phosphor layer by being reflected by the reflecting layer. In this manner, the white light is emitted from the lighting device.

CITATION LIST

Patent Literature

PTL 1: Japanese Unexamined Patent Application Publication No. 2013-229174

SUMMARY OF THE INVENTION

Technical Problems

Here, if a phosphor layer is peeled off from a substrate, laser light having high directivity is reflected by a reflecting layer and emitted to the outside without being converted into white light by phosphor particles. The emission of laser light having high directivity is not desirable because the laser light may affect a human body.

Accordingly, the object of the present invention is to provide a color conversion element and a lighting device which can reduce the emission of laser light to the outside as it is, even if a phosphor layer is peeled off from a substrate.

Solutions to Problems

A color conversion element according to an aspect of the present invention includes: a phosphor layer that includes at least one type of phosphor; a reflecting layer stacked on the phosphor layer; a substrate disposed in a position opposite to the reflecting layer; a joining portion interposed between the reflecting layer and the substrate for joining the reflecting layer and the substrate; and an absorbing portion disposed above a principal surface of the substrate closer to the joining portion, the absorbing portion being covered with the joining portion and absorbing laser light having a wavelength that excites the phosphor.

A lighting device according to another aspect of the present invention includes: the color conversion element; and a light source unit configured to emit laser light as excitation light for exciting the phosphor included in the color conversion element.

Advantageous Effect of Invention

According to the present invention, it is possible to reduce the emission of laser light to the outside as it is, even if a phosphor layer is peeled off from a substrate.

DESCRIPTION OF EXEMPLARY EMBODIMENT

Hereinafter, a color conversion element according to embodiments of the present invention will be described with reference to the drawings. Note that the embodiments described below illustrate particular preferable examples according to the present invention. Therefore, the numerical values, shapes, materials, elements, the arrangement and the connection of the elements, and the like described in the following embodiments are mere examples, and thus are not intended to limit the present invention. Accordingly, among the elements in the following exemplary embodiments, elements not recited in any of the independent claims defining the broadest concept of the present disclosure are described as arbitrary elements.

Note that the drawings are schematic diagrams, and do not necessarily provide strictly accurate illustrations. Throughout the drawings, the same reference numeral is given to the same element.

Hereinafter, an embodiment will be described.

[Lighting Device]

Figure 1:
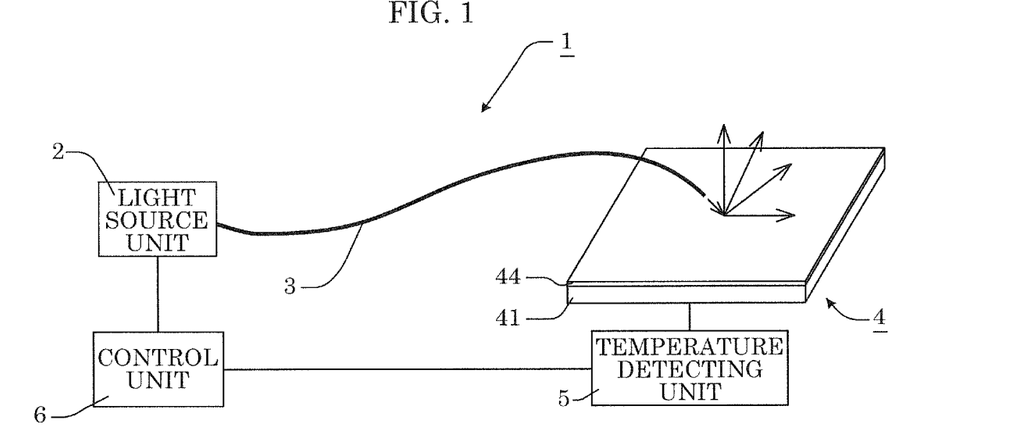
FIG. 1 is a schematic diagram schematically illustrating the configuration of a lighting device according to an embodiment.

First, a lighting device according to the embodiment will be described. FIG. 1 is a schematic diagram schematically illustrating the configuration of a lighting device according to the embodiment.

As illustrated in FIG. 1, lighting device 1 includes light source unit 2, light guiding component 3, color conversion element 4, temperature detecting unit 5, and control unit 6.

Light source unit 2 is a light source unit which emits laser light for exciting a phosphor included in color conversion element 4. Light source unit 2 produces laser light and supplies the laser light to color conversion element 4 via light guiding component 3. For example, light source unit 2 is a semiconductor laser element which emits laser light having a wavelength of violet to blue (430 nm to 490 nm).

Light guiding component 3 is a light guiding component which guides laser light emitted by light source unit 2 to color conversion element 4, and is an optical fiber, for instance.

Color conversion element 4 has an upper surface out of which white light is caused to travel as a result of the emission of laser light transmitted via light guiding component 3 onto the upper surface as excitation light. The details of color conversion element 4 will be described later.

Temperature detecting unit 5 is a component which detects the temperature of substrate 41 included in color conversion element 4 and is attached to color conversion element 4, for instance. The details of temperature detecting unit 5 will be described later.

Control unit 6 includes a central processing unit (CPU), a read-only memory (ROM), a random-access memory (RAM), and the like which are not illustrated in the drawings. The CPU controls the emission of laser light by light source unit 2 by executing a program which has been stored in the ROM and expanded in the RAM. Specifically, control unit 6 is electrically connected to temperature detecting unit 5 and light source unit 2. Control unit 6 causes light source unit 2 to start the emission of laser light when the power source of lighting device 1 is turned on and causes light source unit 2 to cease the emission of laser light when the power source of lighting device 1 is turned off. Note that control unit 6 causes light source unit 2 to cease the emission of laser light when the temperature detected by temperature detecting unit 5 has a value greater than or equal to a predetermined value, even when the power source of lighting device 1 is turned on. In other words, an abnormality can be notified to a user because the emission of laser light by light source unit 2 ceases when the temperature of color conversion element 4 becomes higher than the temperature of color conversion element 4 in a normal condition due to some abnormality. In addition, when color conversion element 4 is in an abnormal condition, the emission of laser light by light source unit 2 ceases, thereby reducing the unnecessary emission of laser light by light source unit 2.

[Color Conversion Element]

Figure 2:
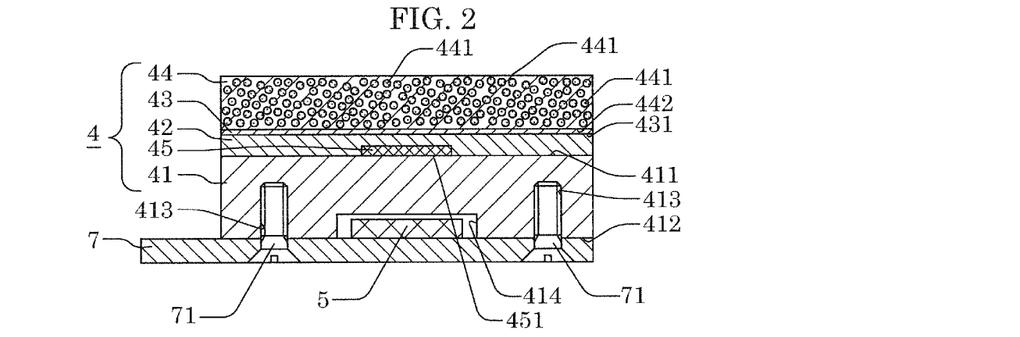
FIG. 2 is a cross-sectional view schematically illustrating the configuration of a color conversion element and a temperature detecting unit according to the embodiment.

Hereinafter, color conversion element 4 will be described. FIG. 2 is a cross-sectional view schematically illustrating the configuration of color conversion element 4 and temperature detecting unit 5 according to the embodiment.

As illustrated in FIG. 2, color conversion element 4 includes substrate 41, joining portion 42, reflecting layer 43, phosphor layer 44, and absorbing portion 45.

Substrate 41 is a substrate in the shape of, for instance, a quadrilateral or a circle when seen in plan view. Substrate 41 is a substrate which has a thermal conductivity higher than the thermal conductivity of phosphor layer 44.

In this manner, heat conducted from phosphor layer 44 can be efficiently dissipated from substrate 41. Specifically, substrate 41 includes a metallic material, such as Cu and Al. Note that as long as the thermal conductivity of substrate 41 is higher than that of phosphor layer 44, substrate 41 may include a material other than the metallic material. Examples of such a material other than the metallic material include ceramics, sapphire, and the like. Note that a first electrode layer (not shown in the drawings) is stacked on principal surface 411 which is one of the principal surfaces of substrate 41. The first electrode layer includes a metallic material, such as Au, Ag, Ni, Pd, and Ti, for instance. The first electrode layer is formed by forming a film of the metallic material using a well-known film forming method, such as sputtering or plating, on principal surface 411 which is one of the principal surfaces of substrate 41.

Principal surface 412 which is the other principal surface of substrate 41 includes threaded holes 413 for fixing temperature detecting unit 5 to color conversion element 4 and recessed portion 414 which houses temperature detecting unit 5. Recessed portion 414 is disposed at a position opposite to absorbing portion 45. Threaded holes 413 are disposed around recessed portion 414.

Phosphor layer 44 is disposed above principal surface 411 which is one of the principal surfaces of substrate 41, with joining portion 42 and reflecting layer 43 interposed therebetween. Phosphor layer 44 has the same shape as substrate 41 when seen in plan view. Phosphor layer 44 includes, in a dispersed state, particles of a phosphor (phosphor particles 441) which emit light when excited by laser light, for instance. Phosphor particles 441 emit light when emitted by laser light. Accordingly, the outer principal surface of phosphor layer 44 is the light emitting surface.

In the present embodiment, phosphor layer 44 emits white light and includes particles of three types of phosphors in a suitable proportion. The three types of phosphors are a red phosphor which emit red light when emitted by laser light, a yellow phosphor which emit yellow light when emitted by laser light, and a green phosphor which emit green light when emitted by laser light.

Although the types and the characteristics of phosphor particles are not particularly limited, phosphor particles having high heat resistance may be used, since relatively high-output laser light is used as excitation light. In addition, although the type of a base material which holds phosphor particles in a dispersed state is not particularly limited, a base material having high light transmittance for the wavelength of excitation light and the wavelength of light emitted from phosphor particles may be used. Specifically, an example of such a base material includes a material which includes glass or ceramics. Note that phosphor layer 44 may be a polycrystalline substance or a monocrystalline substance which includes one type of phosphor.

Reflecting layer 43 is stacked on principal surface 442 which is a principal surface of phosphor layer 44 closer to substrate 41. Reflecting layer 43 reflects laser light and light emitted from phosphor particles 441. Accordingly, reflecting layer 43 includes a material having a high reflectance to laser light and the light emitted from phosphor particles 441. Specifically, examples of a material having a high reflectance include metallic materials, such as Ag and Al. Reflecting layer 43 is formed by forming a film of the metallic material on principal surface 442 of phosphor layer 44, using a well-known film forming method, such as sputtering or plating. In addition, a reflection enhancing film, such as a dielectric multilayer film, for instance, may be formed on the film of the metal material.

Furthermore, it is also possible to interpose an adhesion layer which includes a compound having a light guiding property between reflecting layer 43 and phosphor layer 44. With this, phosphor layer 44 and reflecting layer 43 can be adhered to the adhesion layer without a space therebetween, thereby reducing the decrease in heat transfer performance resulting from the space between phosphor layer 44 and reflecting layer 43. Specifically, examples of the compound included in the adhesion layer include an oxide, a halide, a nitride, a fluoride, and the like. An example of the oxide includes a metallic oxide, such as ITO, IZO, and $Al_2O_3$, for instance. The use of the metallic oxide can improve the adhesion between phosphor layer 44 and reflecting layer 43.

A second electrode layer (not shown in the drawings) is stacked on principal surface 431 which is a principal surface of reflecting layer 43 closer to substrate 41. The second electrode layer includes a metallic material, such as Au, Ag, Ni, Pd, and Ti, for instance. The second electrode layer is formed by forming a film of the metallic material on principal surface 431 of reflecting layer 43, using a well-known film forming method, such as sputtering or plating.

Joining portion 42 is a joining layer interposed between reflecting layer 43 and substrate 41 for joining reflecting layer 43 and substrate 41. Specifically, joining portion 42 is a metal joining portion for joining reflecting layer 43 and substrate 41 using metal. Joining portion 42 includes a metallic material capable of joining reflecting layer 43 and substrate 41. Examples of such a metallic material capable of joining reflecting layer 43 and substrate 41 include an Au—Sn-based solder material, an Au—Ge-based solder material, an Sn—Ag—Cu-based solder material, and Ag nanoparticles, for instance.

Absorbing portion 45 is an absorber which absorbs laser light having a wavelength that excites phosphor particles 441. Absorbing portion 45 is fixed above principal surface 411 of substrate 41 using, for instance, resin, inorganic adhesives, and the like. Absorbing portion 45 which is disposed above principal surface 411 of substrate 41 is covered with joining portion 42. Even when absorbing portion 45 reflects laser light that is emitted onto absorbing portion 45, absorbing portion 45 has absorptivity capable of absorbing the laser light up to a degree that the laser light will not affect a human body. Specifically, absorbing portion 45 is a sheet-shaped component which includes a material capable of absorbing 95% or more of the laser light, or maybe 99% or more of the laser light. Examples of such a material capable of absorbing 95% or more of the laser light include a graphite sheet, anodized aluminum, and the like. Absorbing portion 45 may be disposed at least in a range to which laser light may be emitted. In addition, absorbing portion 45 has a portion, besides a portion at principal surface 451 which is a principal surface of absorbing portion 45 closer to substrate 41 (a portion of absorbing portion), disposed inside joining portion 42. Here, absorbing portion 45 is not joined to joining portion 42. A difference in the characteristics of materials included in absorbing portion 45 and joining portion 42 prevents the adhesion to each other even when absorbing portion 45 and joining portion 42 are joined using metal. Note that it is also possible to provide a space between absorbing portion 45 and joining portion 42 so that absorbing portion 45 is certainly not joined to joining portion 42. If absorbing portion 45 is not joined to joining portion 42 as has been described above, it is possible to improve the exposure of absorbing portion 45 when color conversion element 4 is damaged.

Figure 3:
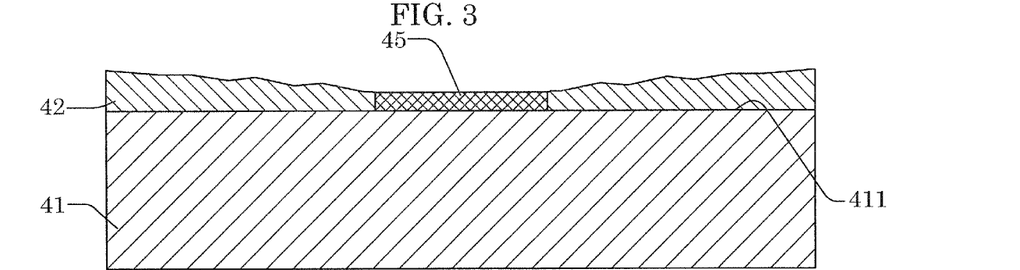
FIG. 3 is an enlarged cross-sectional view illustrating the color conversion element according to the embodiment in a damaged state.

FIG. 3 is an enlarged cross-sectional view illustrating color conversion element 4 according to the embodiment in a damaged state. As illustrated in FIG. 3, when phosphor layer 44 is peeled off from substrate 41 in response to an impact received by color conversion element 4, a portion of joining portion 42 also fractures and is peeled off from substrate 41 together with phosphor layer 44 and reflecting layer 43. When joining portion 42 fractures, a crack occurs and a fracture surface is formed in joining portion 42, but when absorbing portion 45 is not joined to joining portion 42, a portion at which absorbing portion 45 is not joined to joining portion 42 (an upper surface portion of absorbing portion 45) becomes a part of the fractured surface. In other words, the upper surface of absorbing portion 45 is exposed without joining portion 42 adhering to the upper surface of absorbing portion 45. Since absorbing portion 45 can exclusively receive laser light after phosphor layer 44 is peeled off from substrate 41, the laser light can be absorbed by absorbing portion 45.

Figure 4:
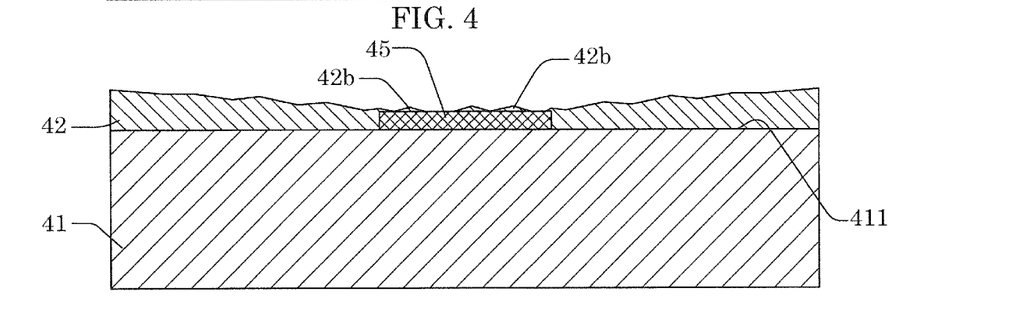
FIG. 4 is an enlarged cross-sectional view illustrating another example of the color conversion element according to the embodiment in a damaged state.

FIG. 4 is an enlarged cross-sectional view illustrating another example of the color conversion element according to the embodiment in a damaged state. Here, the case where absorbing portion 45 is joined to joining portion 42 will be described. As illustrated in FIG. 4, when joining portion 42 fractures, a crack occurs and a fracture surface is formed in joining portion 42. The crack extends along the upper surface portion of absorbing portion 45 and the fracture surface is formed. Specifically, a portion of joining portion 42 (remaining portion 42b) is remained on the upper surface portion of absorbing portion 45. For this reason, remaining portion 42b also receives laser light together with absorbing portion 45 after phosphor layer 44 is peeled off from substrate 41. Although absorbing portion 45 absorbs laser light, remaining portion 42b reflects the laser light. However, the laser light reflected by remaining portion 42b diffuses since the surface of remaining portion 42b has minute irregularities, thereby reducing an effect on a human body.

Figure 5:
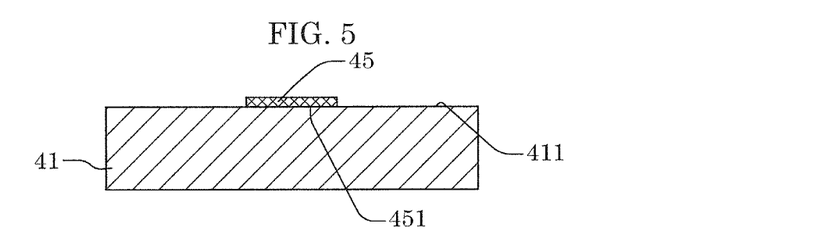
FIG. 5 is a cross-sectional view illustrating a process during the assembly of the color conversion element according to the embodiment.
Figure 6:
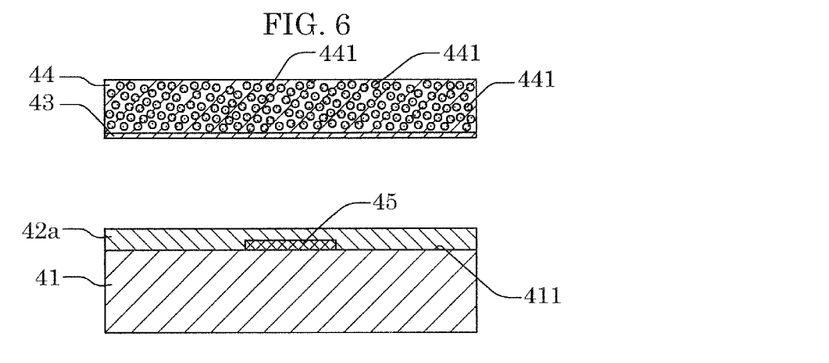
FIG. 6 is a cross-sectional view illustrating a process during the assembly of the color conversion element according to the embodiment.
Figure 7:
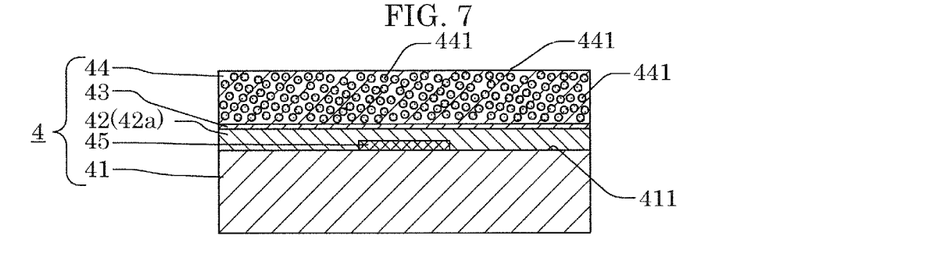
FIG. 7 is a cross-sectional view illustrating a process during the assembly of the color conversion element according to the embodiment.

Next, a state of color conversion element 4 before the assembly of color conversion element 4 will be described. FIG. 5 to FIG. 7 are cross-sectional views illustrating processes during the assembly of color conversion element 4 according to the embodiment. Here, threaded hole 413 is not included in substrate 41 before the assembly of color conversion element 4. Here, the case where threaded hole 413 will be included in substrate 41 after the assembly of color conversion element 4 is illustrated. Certainly, threaded hole 413 may be included in substrate 41 before the assembly.

As illustrated in FIG. 5, absorbing portion 45 is fixed above principal surface 411 of substrate 41 before the assembly of color conversion element 4. Next, as illustrated in FIG. 6, solder material 42a is disposed above principal surface 411 of substrate 41 such that solder material 42a covers absorbing portion 45. On the other hand, reflecting layer 43 is integrally formed with phosphor layer 44 in advance.

Then, as illustrated in FIG. 7, after reflecting layer 43 is brought into contact with solder material 42a, solder material 42a is heated by the application of electricity to the first electrode and the second electrode. Accordingly, solder material 42a melts and joins reflecting layer 43 and substrate 41. Solder material 42a which is interposed between reflecting layer 43 and substrate 41 becomes joining portion 42 for joining reflecting layer 43 and substrate 41.

Note that solder material 42a may be integrally formed with reflecting layer 43 in advance before the assembly of color conversion element 4.

[Temperature Detecting Unit]

As illustrated in FIG. 2, temperature detecting unit 5 is mounted on mounting board 7. Temperature detecting unit 5 is fixed to color conversion element 4 by fastening mounting board 7 to color conversion element 4 with screw 71 through threaded hole 413. Temperature detecting unit 5 is a temperature sensor, for instance, a thermistor and the like for detecting the temperature of substrate 41. Since temperature detecting unit 5 is housed in recessed portion 414 of substrate 41, temperature detecting unit 5 is disposed in a position opposite to absorbing portion 45. Specifically, temperature detecting unit 5 is capable of detecting a change in the temperature of absorbing portion 45. For example, when color conversion element 4 is in a normal condition, absorbing portion 45 maintains substantially a constant temperature since laser light does not reach absorbing portion 45 as a result of the wavelength conversion of the laser light in phosphor layer 44 and the reflection of the laser light by reflecting layer 43. On the other hand, the temperature of absorbing portion 45 rises when phosphor layer 44 and reflecting layer 43 are peeled off from substrate 41 because laser light shines on absorbing portion 45. Accordingly, the temperature of substrate 41 when color conversion element 4 is in an abnormal condition rises up to approximately three times the temperature of substrate 41 when color conversion element 4 is in a normal condition. The value of the temperature of substrate 41 which is approximately three times as great as the temperature of substrate 41 when color conversion element 4 is in a normal condition may be used as a predetermined value which control unit 6 uses as a threshold.

[Operation of Lighting Device]

Next, the operation of lighting device 1 will be described.

When the power source of lighting device 1 is turned on, control unit 6 causes light source unit 2 to start the emission of laser light. When laser light emitted by light source unit 2 is emitted onto phosphor layer 44 via light guiding component 3, a portion of the laser light directly shines on phosphor particles 441. In addition, another portion of the laser light that does not directly shine on phosphor particles 441 is reflected by reflecting layer 43 and shines on phosphor particles 441. Phosphor particles 441 convert the laser light that has reached phosphor particles 441 into white light and emit the white light. A portion of the white light emitted from phosphor particles 441 is directly emitted out of phosphor layer 44. Another portion of the white light emitted from phosphor particles 441 is also emitted out of phosphor layer 44 through the adhesion layer, by being reflected by reflecting layer 43.

Furthermore, as illustrated in FIG. 3, when phosphor layer 44 is peeled off from substrate 41, absorbing portion 45 is exposed. With this, absorbing portion 45 absorbs laser light, and the laser light will not be emitted to the outside. During this time, control unit 6 monitors the temperature detected by temperature detecting unit 5, and when a detected temperature has a value greater than or equal to the predetermined value, control unit 6 ceases the emission of laser light by light source unit 2. Consequently, it is possible to reduce the unnecessary emission of laser light to the outside while an abnormality is notified to a user.

[Effects, Etc.]

As described above, color conversion element 4 according to the present embodiment includes phosphor layer 44 that includes at least one type of phosphor (phosphor particles 441), reflecting layer 43 stacked on phosphor layer 44, substrate 41 disposed in a position opposite to reflecting layer 43, joining portion 42 interposed between reflecting layer 43 and substrate 41 for joining reflecting layer 43 and substrate 41, and absorbing portion 45 disposed above principal surface 411 of substrate 41 closer to joining portion 42. Absorbing portion 45 is covered with joining portion 42 and absorbs laser light having a wavelength that excites phosphor particles 441.

In addition, lighting device 1 according to the present embodiment includes color conversion element 4 and light source unit 2 which emits laser light as excitation light for exciting phosphor particles 441 included in color conversion element 4.

With this configuration, absorbing portion 45 which is covered with joining portion 42 above principal surface 411 of substrate 41 is exposed when phosphor layer 44 and reflecting layer 43 are peeled off from substrate 41 because a portion of joining portion 42 fractures together with phosphor layer 44 and reflecting layer 43. Absorbing portion 45 absorbs laser light because absorbing portion 45 is exposed. Consequently, it is possible to reduce the emission of laser light to the outside as it is.

Furthermore, absorbing portion 45 has a portion disposed inside joining portion 42.

With this configuration, the exposure of absorbing portion 45 can be improved when phosphor layer and the others are peeled off from substrate 41 because absorbing portion 45 can be readily exposed with the fracture of joining portion 42 since absorbing portion 45 has a portion disposed inside joining portion 42. Consequently, it is possible to improve the certainty of reducing the emission of laser light to the outside.

In addition, joining portion 42 is a metal joining portion for joining reflecting layer 43 and substrate 41 using metal.

With this configuration, even when joining portion 42 is a metal joining portion, absorbing portion 45 can be exposed when phosphor layer 44 and the others are peeled off from substrate 41, thereby reducing the emission of laser light to the outside.

In addition, absorbing portion 45 is not joined to joining portion 42.

With this configuration, since absorbing portion 45 is not joined to joining portion 42, the upper surface portion of absorbing portion 45 becomes a part of a fractured surface formed in joining portion 42 when joining portion 42 fractures. Accordingly, the upper surface of absorbing portion 45 is exposed without joining portion 42 adhering to the upper surface of absorbing portion 45. Consequently, laser light can be absorbed by absorbing portion 45.

In addition, lighting device 1 includes temperature detecting unit 5 which detects a temperature of substrate 41 and control unit 6 which ceases emission of laser light by light source unit 2 when the temperature detected by temperature detecting unit 5 has a value greater than or equal to a predetermined value.

With this configuration, control unit 6 ceases the emission of laser light by light source unit 2 when the temperature detected by temperature detecting unit 5 has a value greater than or equal to a predetermined value.

Consequently, the unnecessary emission of laser light can be reduced while an abnormality is notified to a user.

[Variation 1]

Next, Variation 1 will be described.

Figure 8:
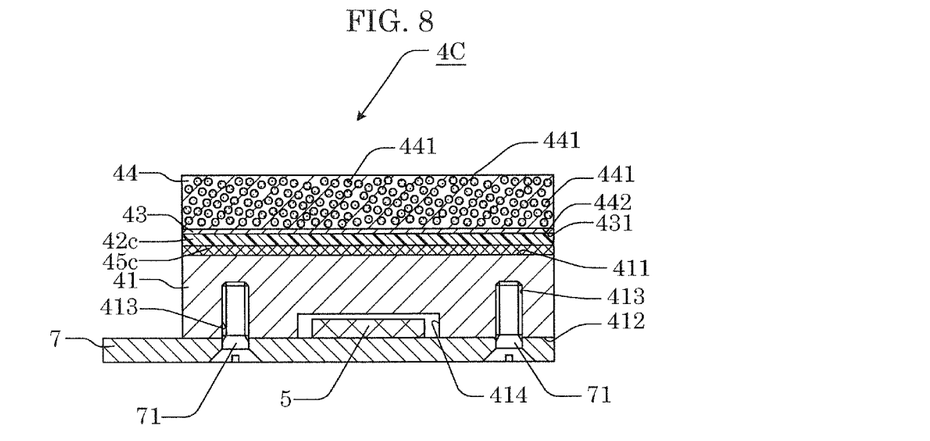
FIG. 8 is a cross-sectional view schematically illustrating the configuration of a color conversion element according to Variation 1.

FIG. 8 is a cross-sectional view schematically illustrating the configuration of color conversion element 4C according to Variation 1. Specifically, FIG. 6 corresponds to FIG. 2. Note that in subsequent descriptions, the same reference numeral is given to a component equivalent to a component included in color conversion element 4 and descriptions for the component is omitted. The following only describes the points different from the embodiment.

The above embodiment has exemplified and described the case where joining portion 42 is a metal joining portion. However, Variation 1 describes the case where joining portion 42c is a resin joining portion.

Joining portion 42c is a resin joining portion which includes resin. In the case where joining portion 42c is a resin joining portion, joining portion 42c adheres well to absorbing portion 45c. For this reason, absorbing portion 45c can be securely integrated with joining portion 42c even if absorbing portion 45c is disposed between the entirety of substrate 41 and the entirety of joining portion 42c. Examples of a resin material which is included in joining portion 42c include, for instance, a colorless, silicon-based resin material and the like. If the resin material is a colored resin material, the resin material absorbs laser light when phosphor layer 44 is fractured. This may cause the resin material to become hot and may even cause the resin material to ignite. However, when the resin material is a colorless resin material, absorbing portion 45c absorbs laser light, thereby reducing the emission of the laser light to the outside. Also, the increase in the temperature of joining portion 42c can be reduced by the conduction of heat to substrate 41. Note that, like joining portion 42 described above, joining portion 42c which is a resin joining portion may be disposed at least in a range to which the laser light may be emitted.

[Variation 2]

Next, Variation 2 will be described.

Figure 9:
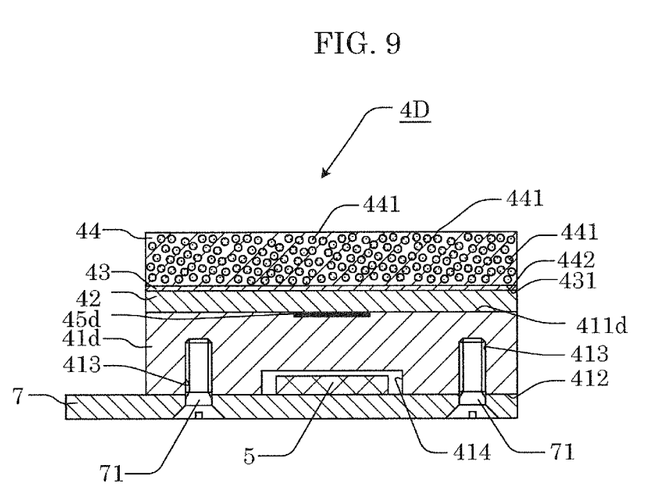
FIG. 9 is a cross-sectional view schematically illustrating the configuration of a color conversion element according to Variation 2.

FIG. 9 is a cross-sectional view schematically illustrating the configuration of a color conversion element according to Variation 2. Specifically, FIG. 7 corresponds to FIG. 2.

The above embodiment has exemplified and described the case where absorbing portion 45 is a sheet-shaped component disposed above principal surface 411 of substrate 41. However, Variation 2 describes absorbing portion 45d included in color conversion element 4D which is formed in principal surface 411d of substrate 41d will be described.

Specifically, absorbing portion 45d is formed in principal surface 411d of substrate 41d by the modification of properties of at least a portion of principal surface 411d of substrate 41d, and is covered with joining portion 42. A method used for the modification increases the absorptivity of the portion of principal surface 411d to laser light, compared to principal surface 411d whose properties are not modified. For example, when substrate 41d is an Al substrate, a property modification method of anodizing a portion of the Al substrate by covering the Al substrate, except for the portion, with a mask or a resist film is used.

Other Embodiments

The above has described the lighting device according to the present invention based on the embodiment and Variations 1 and 2 described above, yet the present invention is not limited to the embodiment and Variations 1 and 2 described above.

Although the embodiment and Variations 1 and 2 described above has exemplified and described the case where color conversion elements 4, 4C, and 4D are applied to lighting device 1, color conversion elements 4, 4C, and 4D can also be used for the other lighting devices. Examples of such lighting devices include, for instance, a projector, a headlight for a vehicle, and the like. When color conversion element 4 is applied to a projector, color conversion element 4 is used as a phosphor wheel.

In addition, an antireflection (AR) layer, such as an antireflection-coated film, can be stacked on a surface opposite to principal surface 442 of phosphor layer 44, namely the light emitting side of a surface of phosphor layer 44. In this manner, it is possible to improve the optical extraction efficiency of the color conversion elements.

Furthermore, the above embodiment has exemplified and described joining portion 42 formed by melting solder material 42a. However, the joining portion of the color conversion element may include any thing as long as the joining portion is a metal joining portion that joins the reflecting layer and the substrate of the color conversion element using metal. For example, the joining portion may be a solid metal joining portion. For example, the joining portion may be a layer formed by sintering a paste that includes metal nanoparticles which is interposed between the substrate and the reflecting layer. In this case, since the thickness of the joining portion can be made greater than that of joining portion 42 which includes solder material 42a, the stress release effect of the joining portion can be improved. Furthermore, since the joining portion can obtain a porous structure, the stress release effect can be further improved in this respect. Particularly, metal nanoparticles, such as silver nanoparticles, are readily available and have excellent heat dissipation. Copper nanoparticles are expected to have the same effects as the silver nanoparticles as well.

In addition, although the above embodiment has exemplified and described lighting device 1 which includes temperature detecting unit 5, lighting device 1 need not include temperature detecting unit 5.

In addition, the forms obtained by applying various modifications to the embodiment which may be conceived by a person skilled in the art, and forms achieved by arbitrarily combining elements and functions in the embodiment and Variations 1 and 2, without departing from the scope of the present invention, are also included in the present invention.

The invention claimed is:

1. A color conversion element, comprising:
   a phosphor layer that includes at least one type of phosphor;
   a reflecting layer stacked on the phosphor layer;
   a substrate disposed in a position opposite to the reflecting layer;
   a joining portion interposed between the reflecting layer and the substrate for joining the reflecting layer and the substrate; and
   an absorbing portion disposed above a principal surface of the substrate closer to the joining portion, the absorbing portion being covered with the joining portion and absorbing laser light having a wavelength that excites the phosphor,
   wherein the absorbing portion has a portion disposed inside the joining portion.

2. The color conversion element according to claim 1, wherein the joining portion is a metal joining portion for joining the reflecting layer and the substrate using metal.

3. A lighting device, comprising:

the color conversion element according to claim 1; and a light source unit configured to emit laser light as excitation light for exciting the phosphor included in the color conversion element.

4. The lighting device according to claim 3, further comprising:

a temperature detecting unit configured to detect a temperature of the substrate; and a control unit configured to cease emission of the laser light by the light source unit when the temperature detected by the temperature detecting unit has a value greater than or equal to a predetermined value.

5. A color conversion element, comprising:

a phosphor layer that includes at least one type of phosphor;

a reflecting layer stacked on the phosphor layer;

a substrate disposed in a position opposite to the reflecting layer;

a joining portion interposed between the reflecting layer and the substrate for joining the reflecting layer and the substrate; and an absorbing portion disposed above a principal surface of the substrate closer to the joining portion, the absorbing portion being covered with the joining portion and absorbing laser light having a wavelength that excites the phosphor, wherein the absorbing portion is not joined to the joining portion.

6. A lighting device, comprising:

the color conversion element according to claim 5; and a light source unit configured to emit laser light as excitation light for exciting the phosphor included in the color conversion element.

7. The lighting device according to claim 6, further comprising:

a temperature detecting unit configured to detect a temperature of the substrate; and a control unit configured to cease emission of the laser light by the light source unit when the temperature detected by the temperature detecting unit has a value greater than or equal to a predetermined value.

* * * * *